United States Patent
Lin et al.

(10) Patent No.: US 7,863,147 B2
(45) Date of Patent: Jan. 4, 2011

(54) SEMICONDUCTOR DEVICE AND FABRICATION METHOD THEREOF

(75) Inventors: Chih-Ping Lin, Taipei County (TW);
Pi-Kuang Chuang, Taichung (TW);
Hung-Li Chang, Hsinchu County (TW);
Shih-Ming Chen, Hsinchu (TW);
Hsiao-Ying Yang, Hsinchu (TW);
Ya-Sheng Liu, Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 217 days.

(21) Appl. No.: 12/177,766

(22) Filed: Jul. 22, 2008

(65) Prior Publication Data

US 2009/0236665 A1    Sep. 24, 2009

(30) Foreign Application Priority Data

Mar. 21, 2008    (TW) .............................. 97110055 A

(51) Int. Cl.
*H01L 21/00*    (2006.01)
(52) U.S. Cl. .................. 438/301; 257/E21.19; 438/529

(58) Field of Classification Search ......... 438/228–231, 438/301, 529; 257/E21.19
See application file for complete search history.

(56) References Cited

U.S. PATENT DOCUMENTS

| 4,277,881 | A | * | 7/1981 | Godejahn, Jr. | .............. | 438/287 |
| 4,587,711 | A | * | 5/1986 | Godejahn, Jr. | .............. | 438/287 |
| 5,342,802 | A | * | 8/1994 | Kubokoya et al. | .......... | 438/232 |
| 5,478,761 | A | * | 12/1995 | Komori et al. | ............. | 438/228 |
| 6,133,081 | A | * | 10/2000 | Kim | ........................ | 438/227 |
| 6,309,940 | B1 | * | 10/2001 | Lee | ............................ | 438/370 |
| 2006/0270103 | A1 | | 11/2006 | Das et al. | | |

* cited by examiner

*Primary Examiner*—Richard A. Booth

(57) ABSTRACT

A semiconductor device and a fabrication method thereof are provided. The semiconductor device includes a semiconductor substrate which comprise a first type well and a second type well, and a plurality of junction regions therebetween, wherein each of the junction regions adjoins the first and the second type wells. A gate electrode disposed on the semiconductor substrate and overlies at least two of the junction regions. A source and a drain are in the semiconductor substrate oppositely adjacent to the gate electrode.

15 Claims, 10 Drawing Sheets

US 7,863,147 B2

SEMICONDUCTOR DEVICE AND FABRICATION METHOD THEREOF

CROSS REFERENCE TO RELATED APPLICATIONS

This Application claims priority of Taiwan Patent Application No. 97110055, filed on Mar. 21, 2008, the entirety of which is incorporated by reference herein.

BACKGROUND OF THE INVENTION

1. Field of the Invention

The present invention relates to a method for fabricating a semiconductor device, and in particular relates to a method for fabricating a semiconductor device for increasing operation voltage.

2. Description of the Related Art

High voltage MOS transistors are widely used in many electronic devices, such as central processing unit voltage supply devices, power supply manager system devices and AC/DC inverters and the like. Because high voltage MOS transistors are usually operated under high operation voltage, a high electric field may be formed, resulting in a large number of hot electrons near the junction region of the channel and the drain. The hot electrons will excite the electrons near the drain to the conduction band to form an electron-hole pair, thereby affecting covalent electrons near the drain. Most of the electrons ionized by hot electrons may move to the drain to increase drain current ($I_{sub}$), and a small portion of the ionized electrons may be injected into and trapped by the gate oxide, resulting in changing the threshold voltage of a gate electrode. Additionally, the holes resulting from hot electrons may flow to the substrate to produce a drain current ($I_{sub}$). Thus, when the operation voltage increase, the number of electron-hole pair increases and results in "carrier multiplication".

FIG. 1 shows a cross-section view of a traditional high voltage MOS transistor with a lateral diffused drain. As FIG. 1 shows, a high voltage MOS transistor 130 is formed on a semiconductor wafer 110. The semiconductor wafer 110 has a P-type silicon substrate 111 and a P-type epitaxial layer 112 formed on the P-type silicon substrate 111. The high voltage MOS transistor 130 has a P-type well 121, N-type source region 122 formed in the P-type well 121, an N-type drain region 124 formed in the P-type epitaxial layer 112, and a gate electrode 114.

When the drain current mentioned above flows through the P-type silicon substrate 111, the resistance ($R_{sub}$) of the P-type silicon substrate 111 may produce an induced voltage ($V_b$). If the induced voltage is large enough, forward bias may occur between the P-type silicon substrate 111 and the source region 122 to form a parasitic bipolar transistor 140. When the parasitic bipolar transistor 140 is turned on, the current from the drain region 124 flowing to source region 122 is rapidly increased, resulting in electrical breakdown to cause the high voltage MOS transistor 130 to malfunction.

In some high voltage MOS devices, in order to provide a high voltage, "double diffused drain" structures are used in the source and drain. FIG. 2 shows a high voltage MOS transistor with a double diffused drain structure disclosed by U.S. Pat. No. 5,770,880. A substrate 210 has an N-type body 212. A gate 220 on a gate oxide 222 is formed between a source 230 and a drain 240. The source and drain are substantially the same and interchangable, therefore only the drain is described in the flowing. Every drain has a double diffuse region comprising a first heavily doped contact region 214 and a lightly doped region 216. The diffusion regions are formed by implanting P-type ions such as boron into the exposed surface of the substrate after forming an open 219 on the oxide layer and performing an annealing process to make P-type ions diffuse into the substrate 210 to form the doped regions 214 and 216. The contact region 214 is usually limited on the surface of the N-type body 212 and do not extend into the N-type body 212. The second lightly doped region 216 extends into the N-type body 212 and a portion of the second lightly doped region 216 is under the gate electrode 220. A junction region is formed between the doped region 216 and N-type body 212 and the junction region determines the breakdown voltage value of the device. The diffusion doped region 216, having a low doping concentration gradient, may decrease the reverse bias electric field near the body-drain junction region. Specifically, this allows the device to operate under a high voltage before reaching the breakdown voltage. However, fabricating the device mentioned above requires a complicated process and additional masks may be needed, thus increasing costs. Therefore, a new semiconductor device and a fabrication method thereof are needed to improve the breakdown voltage of the device without incurring extra costs.

BRIEF SUMMARY OF THE INVENTION

The invention provides a method for fabricating a semiconductor device, comprising: providing a semiconductor substrate; forming a first type well in the semiconductor substrate; and forming a second type well and a plurality of junction regions in the semiconductor substrate, wherein each of the junction region is between the first and the second type wells, and adjoins the first and the second type wells.

The invention also provides a semiconductor device, comprising: a semiconductor substrate comprising a first type well and a second type well, and a plurality of junction regions therebetween, wherein each of the junction regions adjoins the first and the second type wells; a gate electrode on the semiconductor substrate and overlies at least two of the junction regions; and a source and a drain in the semiconductor substrate are oppositely adjacent to the gate electrode.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
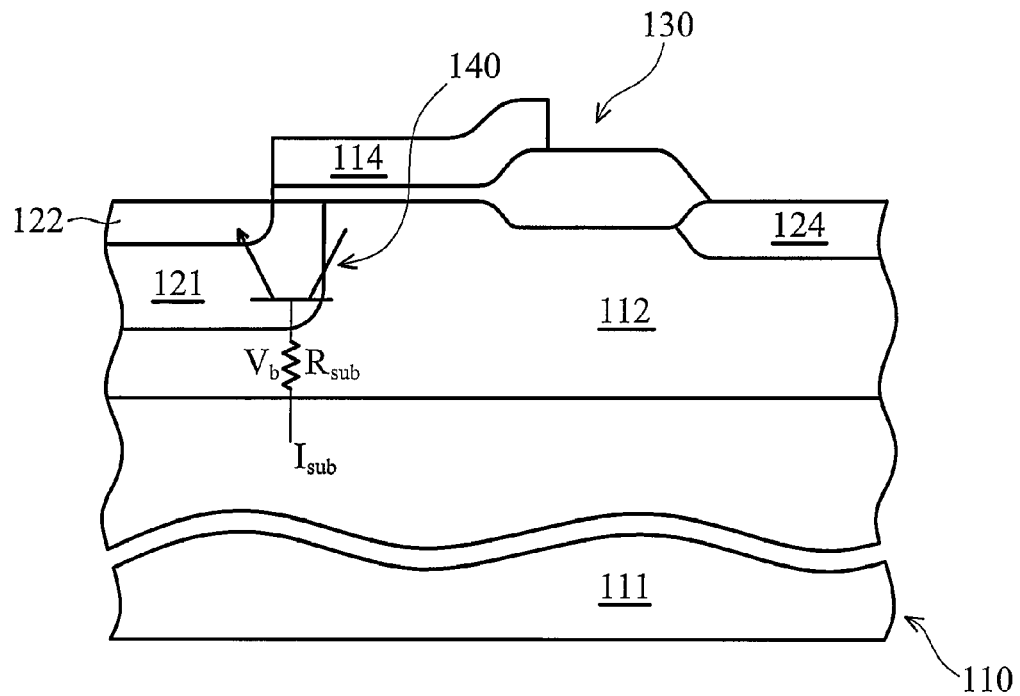
FIG. 1 is a cross section view of a traditional semiconductor device.
Figure 2:
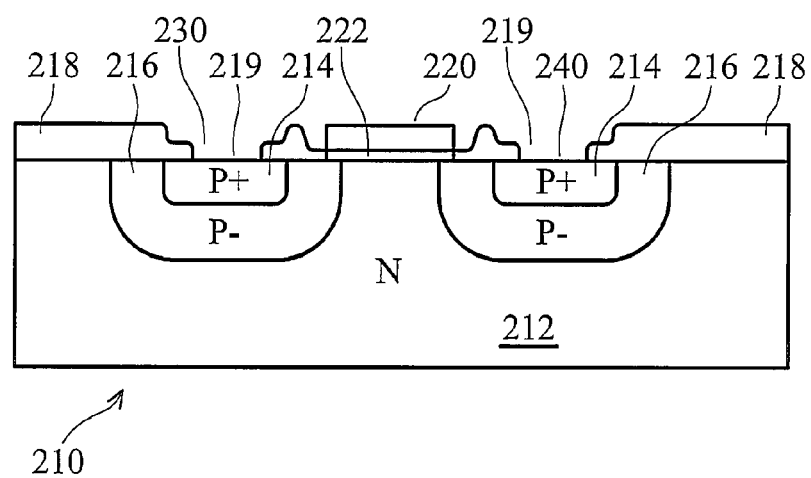
FIG. 2 is a cross section view of a traditional semiconductor device.

The following description is of the best-contemplated mode of carrying out the invention. This description is made for the purpose of illustrating the general principles of the invention and should not be taken in a limiting sense. The scope of the invention is best determined by reference to the appended claims.

Reference will be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

FIGS. 3-9 are cross section views illustrating the step for fabricating a semiconductor device according to an embodiment of the invention.

Figure 3:
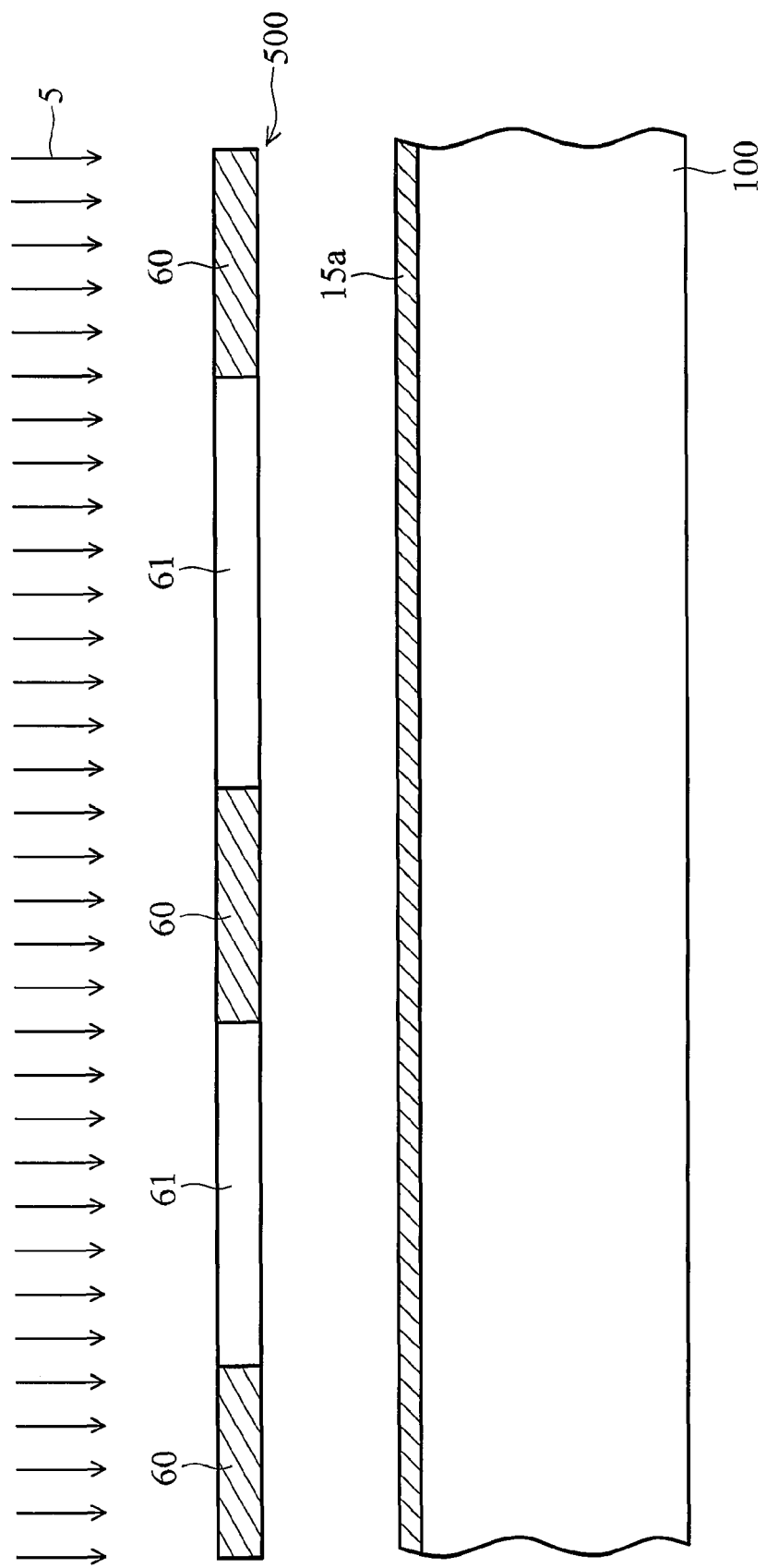
FIGS. 3-9 are cross section views illustrating the step for fabricating a semiconductor device according to an embodiment of the invention.

Referring to FIG. 3, first, a semiconductor substrate such as a P-type substrate 100 is provided. The P-type substrate 100 is preferably a silicon substrate. In other embodiments, the P-type substrate 100 comprises SiGe, silicon on insulator (SOI) substrate or other semiconductor material substrates. Then, a lithography process is performed and a photoresist layer 15a is applied on the P-type substrate 100. After that, a mask 500, comprising an opaque area 60 and a transparent area 61, is provided. Light 5 is then made to pass through mask 500 to perform an exposure process to transfer a pattern on the mask 500 onto the photoresist layer 15a on the P-type substrate 100.

Figure 4:
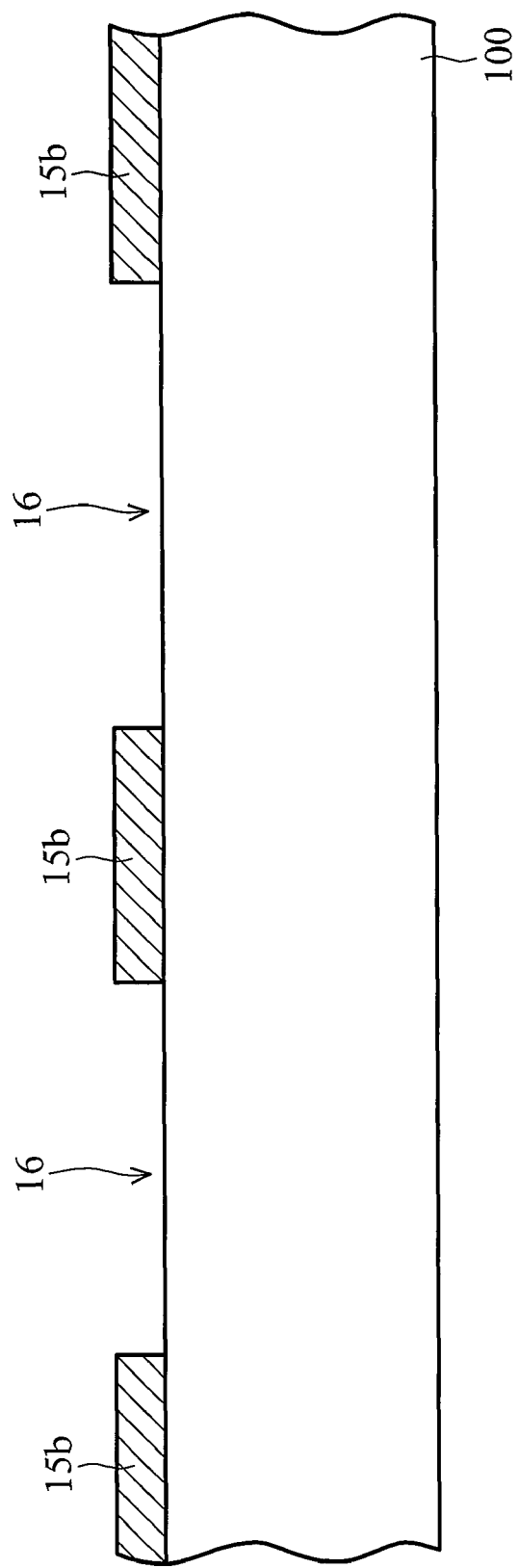

As FIG. 4 shows, a development is performed and a portion of the photoresist layer 15a which is not covered by opaque area 60 is removed to form a patterned photoresist layer 15b. The patterned photoresist layer 15b is used to define a predetermined area of the first type ion implant region 16.

Figure 5:
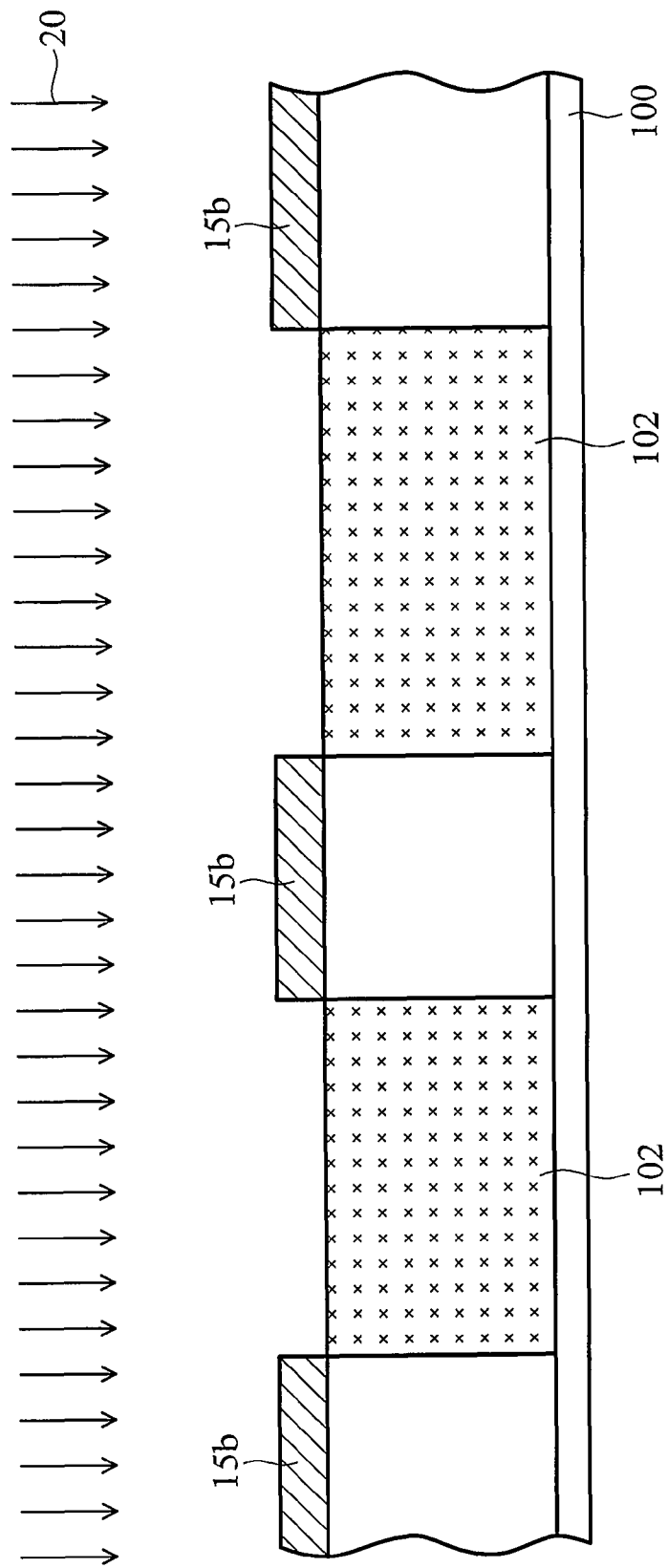

FIG. 5 illustrates the P-type substrate 100, wherein a first type ion implant is performed by using the patterned photoresist layer 15b as a mask to form a first type well 102 in the P-type substrate 100. The first type ions mentioned above may be N-type or P type ions.

In the embodiment, the steps of forming a mask 500 comprise first providing a first integrated circuit layout database comprising data of the first type well and then forming the mask 500 by using the first integrated circuit layout database.

Figure 6A:
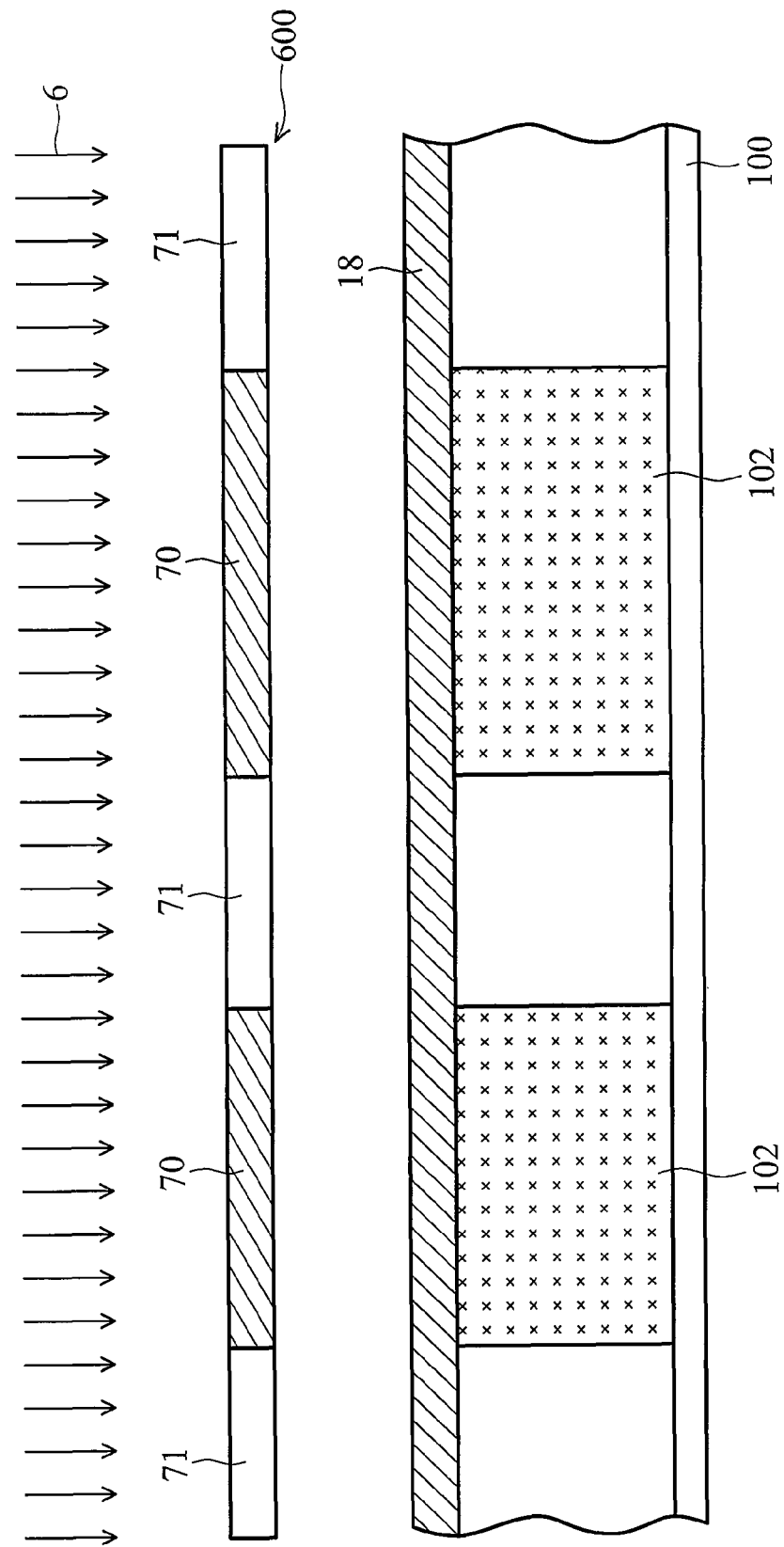

Referring to FIG. 6A, after removing the patterned photoresist layer 15b, a photoresist layer 18 is blanketly deposited on the P-type substrate 100. After that, a mask 600 comprising an opaque area 70 and a transparent area 71 is provided. Light 6 is then made to pass through mask 600 to perform an exposure process to transfer a pattern on the mask 600 onto the photoresist layer 18 on the P-type substrate 100.

Figure 7:
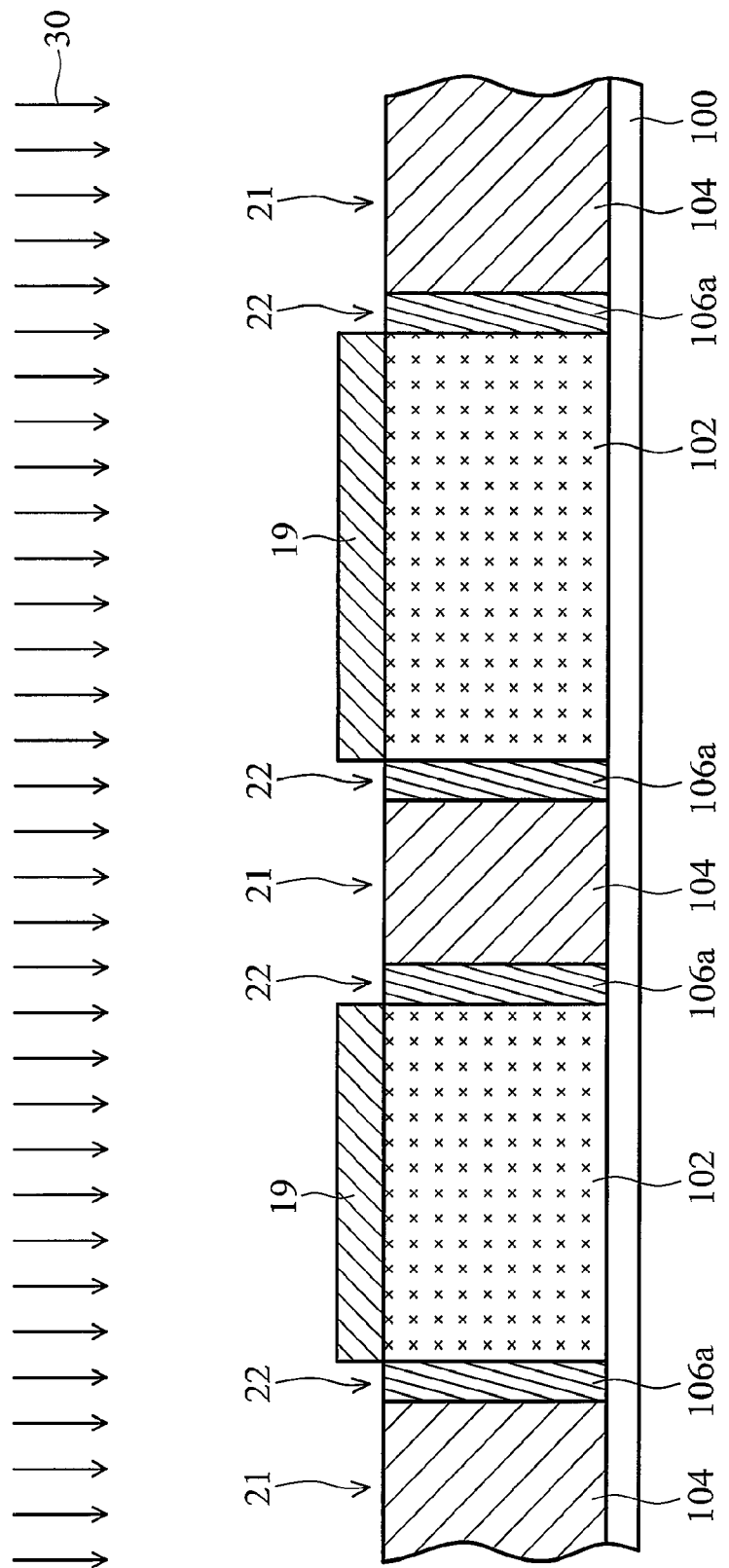

As FIG. 7 shows, a development is performed and a portion of the photoresist layer 18 which is not covered by the opaque area 70 is removed to form a patterned photoresist layer 19. The patterned photoresist layer 19 is used to define predetermined areas of the second type ion implant region 21 and junction region 22. A second type ion implant is performed on the P-type substrate 100 by using the patterned photoresist layer 19 as a mask to form a second type well 104 and a plurality of junction regions 106a in the P-type substrate 100. The second type ions mentioned above may be N-type or P type ions and have an opposite conductive type to the first type ions. It is noted that, the mask 600 and the mask 500 have patterns which are complementary to each other. Therefore, by adjusting ranges of opaque areas and transparent areas of the two masks, the plurality of junction regions 106a may be formed between the first type well 102 and the second type well 104 and each of the junction regions adjoins the first and the second type wells. The steps of forming the mask 600 comprise providing a second integrated circuit layout database comprising data of the first type well 102, data of the second type well 104 and data of the plurality of junction regions 106a, then accessing the second integrated circuit layout database and performing a Boolean logic operation to obtain an operation result, and finally using the operation result to form the mask 600. The length of the plurality of junction regions is about 0.2-5 µm, preferably 0.5-1.5 µm.

Referring to FIGS. 3-7 again, in the embodiment, an additional opaque area (Fig. not shown) is formed between opaque areas 60 and 70 by reducing the opaque range of the opaque areas 60 (as FIG. 3 shown) of the mask 500 or the opaque areas 70 of the mask 600 (as FIG. 6A shown). This may laterally extend the range of the first type well 102 and the second type well 104, resulting in edges of the first type well 102 and the second type well 104 having doped overlapped regions. Therefore, after completing the first ion implant 20 and the second ion implant 30, respectively, a plurality of junction regions 106a, which are both doped with the first and second type ions, may be formed. In one embodiment, the implant dosage of the first type ion implant 20 is greater than that of the second type ion implant 30, and thus a lightly doped first type ion region may be formed in the junction regions 106. In other embodiment, a lightly doped second type ion region may be formed in the junction regions by doping second type ions having a concentration higher than that of the first type ions.

Figure 6B:
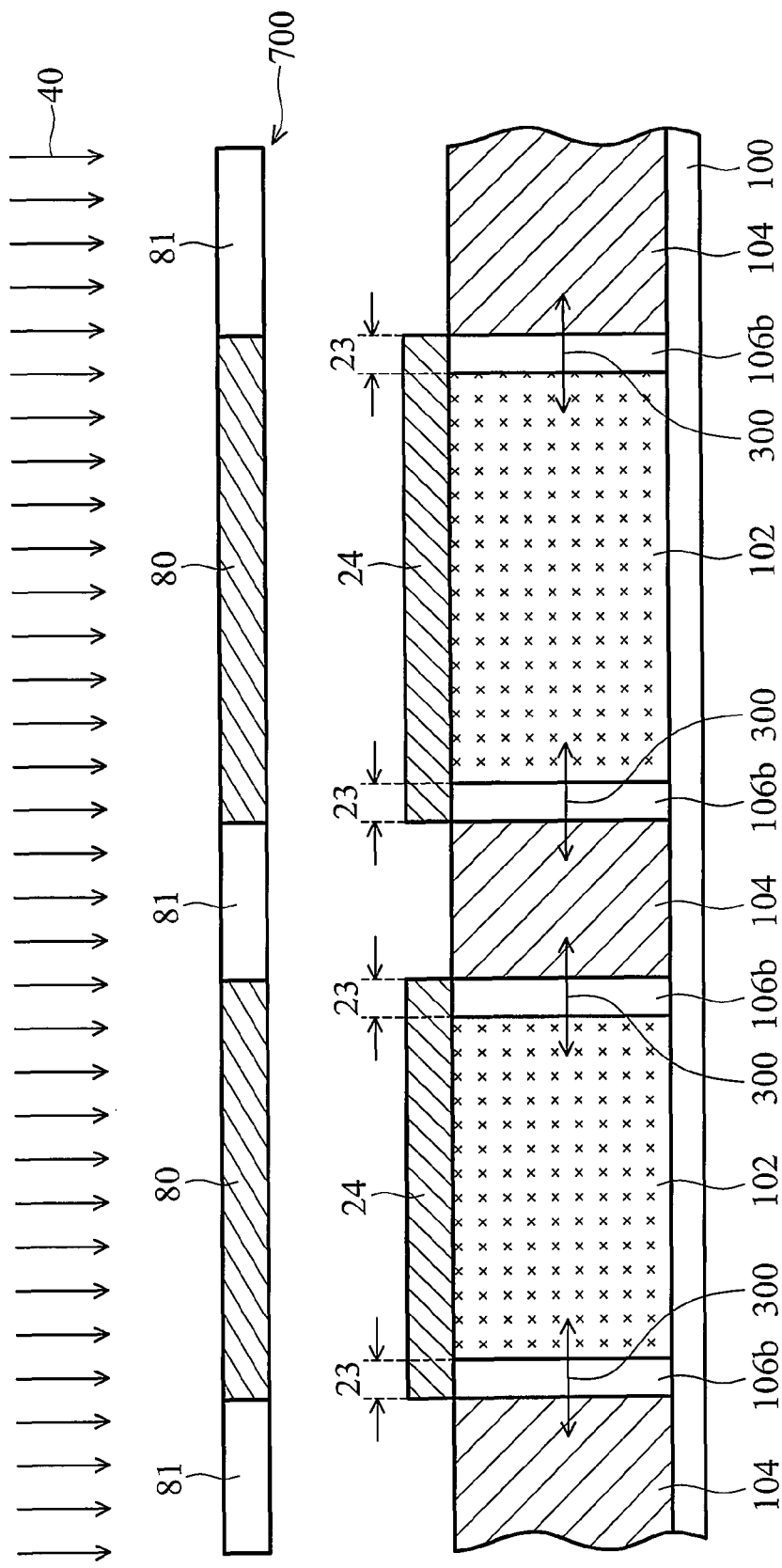

FIG. 5 and FIG. 6B illustrate another embodiment of forming junction regions in the P-type substrate 100. Compared with the embodiment in FIG. 7, the opaque range of the opaque area 80 of the mask 700 is larger than that of the opaque area 70 of the mask 600, and thus the range of the first type well 102 and the second type well 104 may be laterally reduced to form a plurality of junction regions 106b without doping the first and second type ions mentioned above, after completing the first ion implant 20 and the second ion implant 40. In other words, the junction regions have substantially the same conductive type with the P-type substrate 100.

Figure 8:
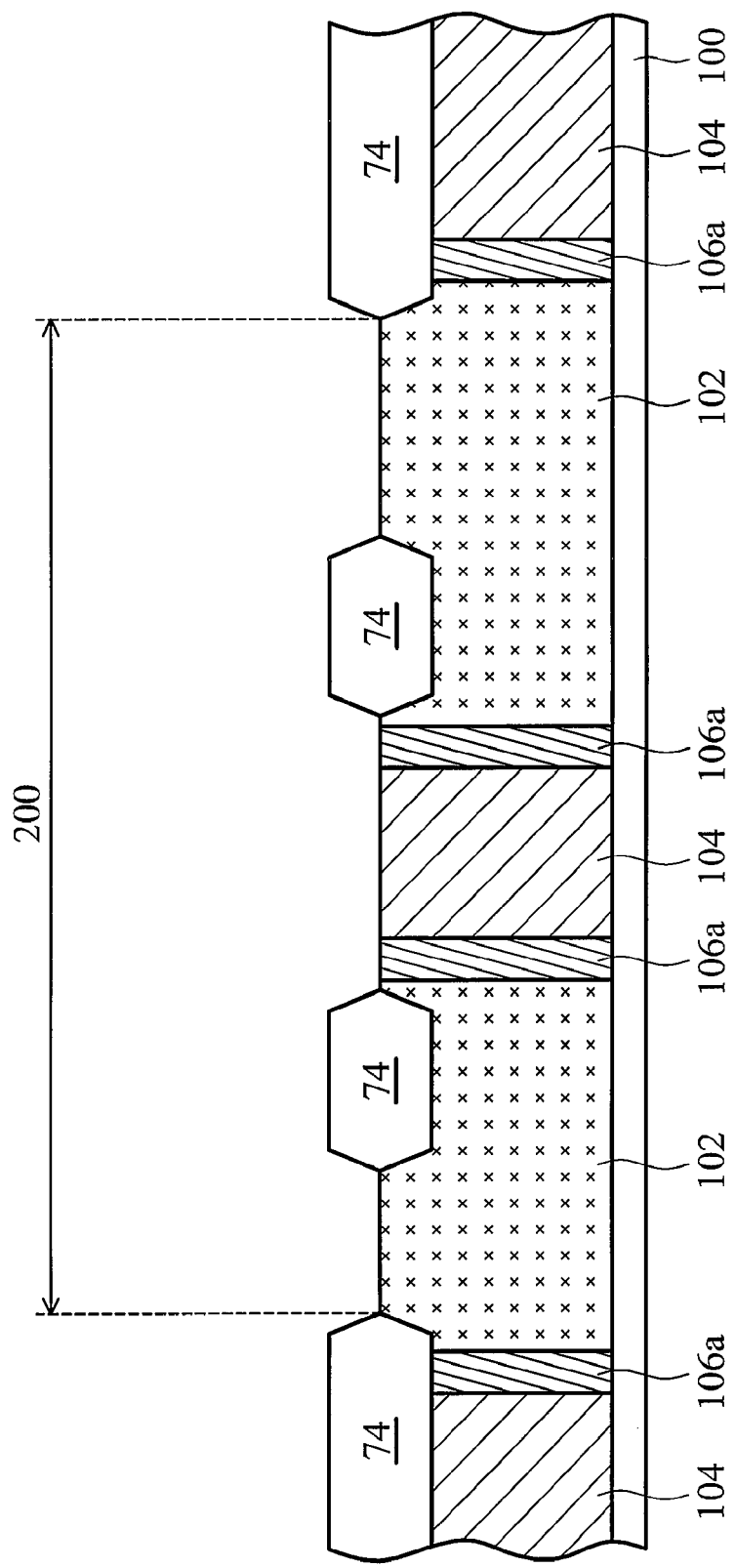

FIG. 7 and FIG. 8 illustrate a plurality of isolation structures, such as a shallow trench isolation (STI) structure 74, formed in the P-type substrate 100 to define a device region 200. In general, the steps of forming the shallow trench isolations comprise forming a trench, filling the trench with a dielectric material such as a high-density plasma oxide, and then performing a planarization process such as a chemical mechanical polishing process to remove the excess dielectric material to form the shallow trench isolations. However, the isolation structures may also be field oxides (FOX) formed by local oxidation of silicon.

Figure 9:
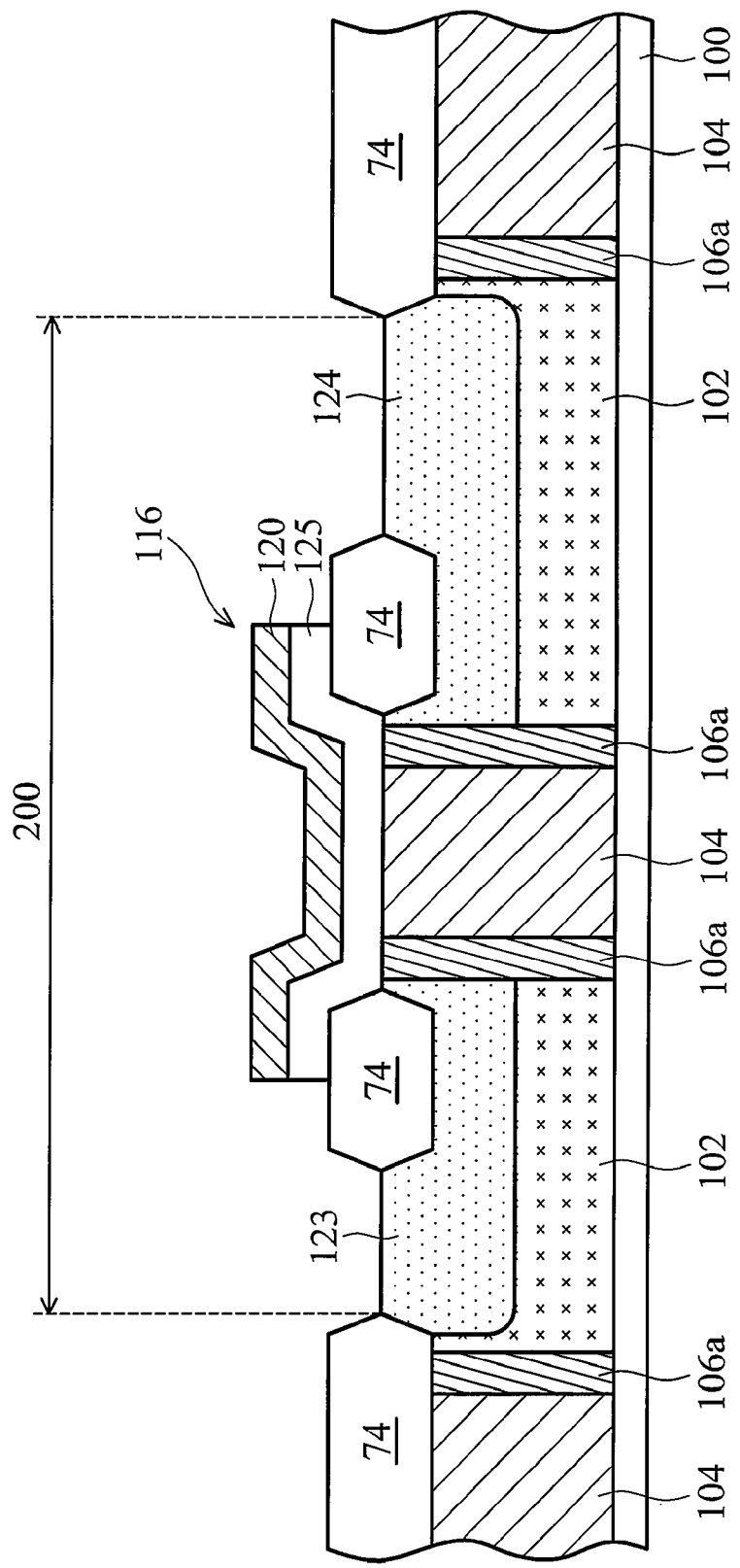

FIG. 9 illustrates a MOS device 116 formed on device region 200. The MOS device 116 further comprises a gate dielectric layer 125. In one preferred embodiment, the gate dielectric layer 125 comprises an oxide layer, and the gate dielectric layer 125 may be formed by a process such as a dry or wet thermal oxidation oxide process in the atmosphere with oxide, water, NO or the combinations thereof, or by a CVD process using tetraethoxysilane (TESO) and oxygen as a precursor. The steps of forming the MOS device 116 comprise first forming a gate electrode 120 on the P-type substrate 100, wherein the gate electrode 120 overlies at least two of the junction regions 106a, then forming a source 123 and a drain 124 in the semiconductor substrate which is oppositely adjacent to the gate electrode. The source 123 and drain 124 may be formed by well-known ion implant processes and the source 123 and drain 124 have the same conductive type with the first type well 102.

The gate electrode 120 preferably comprises the conductive material of Ta, Ti, Mo, W, Pt, Al, Hf, Ru, or silicide or nitride thereof. In one preferred embodiment, the gate electrode 120 is composed of polysilicon and may be formed by depositing doped or undoped polysilicon through a CVD process.

The gate electrode 120 and gate dielectric layer 125 may be patterned, for example, by a lithography process. In general, the lithography process comprises applying a photoresist material, then masking, exposing, and developing the photoresist material to form a photoresist mask. After patterning the photoresist mask, an etch process is performed to remove the unwanted portion, thus forming the gate electrode 120 and gate dielectric layer 125 mentioned above.

Similarly, in other embodiments, using the method mentioned above, a MOS device 116 may be formed with a gate electrode 120, a gate dielectric layer 125, a source 123, and a drain 124 on the P-type substrate 100 of the embodiment in FIG. 6B, wherein the gate electrode 120 overlies at least two of the junction regions 106b (not shown).

It is noted that because the junction regions 106a and 106b are between the first type well 102 and the second type well 104, the PN junctions may be formed between the second type well 104 under the source 123 and the second type well 104 under the gate electrode 120, and between the second type well 104 under the drain 124 and the second type well 104 under the gate electrode 120, respectively. A depletion region may be formed in the second type well 104 under the source 123 and/or drain 124 and gate electrode 120 by the PN junctions. With the depletion region, breakdown voltage may increase during operation and the range of operation voltage of the device may be increased.

Figure 10A:
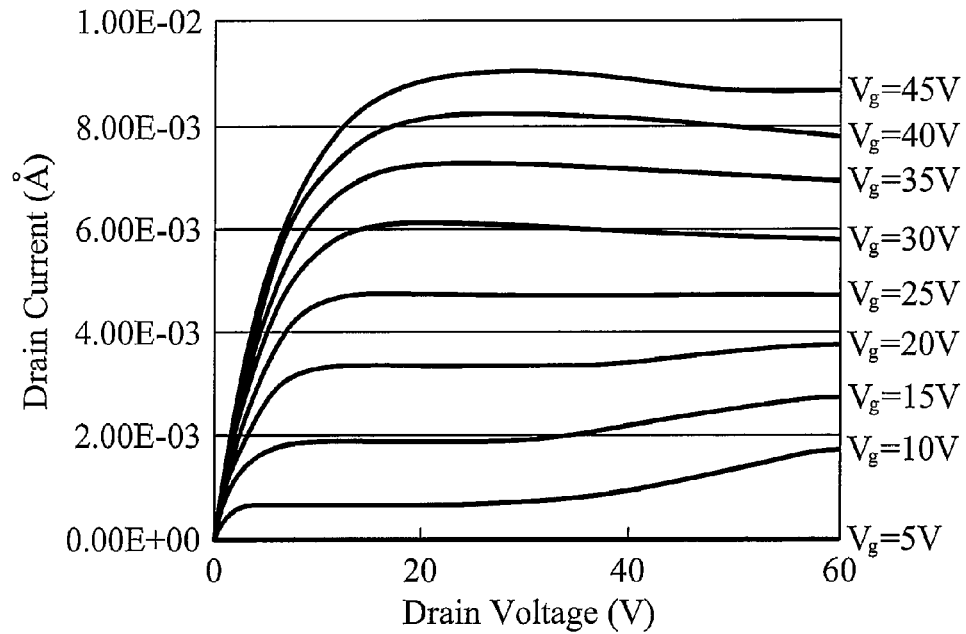
FIG. 10A shows a drain voltage-drain current measurement value of a traditional semiconductor device.
Figure 10B:
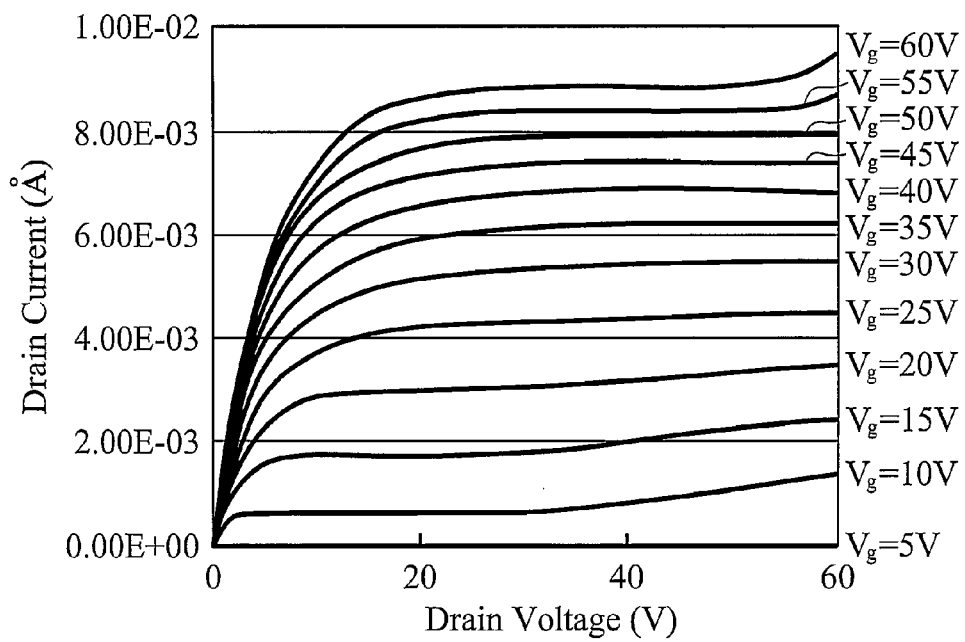
FIG. 10B shows a drain voltage-drain current measurement value of an example of the invention.

Referring to FIGS. 10A and 10B, under different gate operation voltage, drain voltage-drain current measurement values of a traditional semiconductor device and an embodiment of semiconductor device of the invention, respectively, are shown. As FIG. 10A shows, the gate operation voltage ($V_g$) is about 0-45 V. However, as shown in FIG. 10B, the gate operation voltage ($V_g$) of an embodiment of semiconductor device of the invention may be raised to about 0-60 V. Specifically, compared with the conventional semiconductor device, the range of the gate operation voltage may be raised to 30% by using the embodiment of semiconductor device of the invention. Moreover, an additional process is not needed in the method for fabricating the embodiment of semiconductor device. Processes substantially the same with well-known processes may be used, and thus, costs are not increased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor device, comprising:
   providing a semiconductor substrate;
   forming a first type well in the semiconductor substrate; and
   forming a second type well and a plurality of junction regions in the semiconductor substrate, wherein each of the junction regions is between the first and the second type wells, and adjoins the first and the second type wells, and wherein the step of forming the first type well, the second type well and the plurality of junction regions, comprises:
   forming a first photoresist layer on the semiconductor substrate;
   providing a first mask;
   using the first mask to perform an exposure to transfer a pattern on the first mask onto the first photoresist layer on the semiconductor substrate;
   using the first photoresist layer as a mask to perform a first type ion implant to form the first type well in the semiconductor substrate;
   removing the first photoresist layer;
   forming a second photoresist layer on the semiconductor substrate;
   providing a second mask;
   using the second mask to perform an exposure to transfer a pattern on the second mask onto the second photoresist layer on the semiconductor substrate; and
   using the second photoresist layer as a mask to perform a second type ion implant to form the second type well and the plurality of junction regions in the semiconductor substrate, wherein each of the junction region is between the first and the second type wells, and adjoins the first and the second type wells.

2. The method as claimed in claim 1, further comprising:
   forming a gate electrode on the semiconductor substrate; and
   forming a source and a drain in the semiconductor substrate which is oppositely adjacent to the gate electrode.

3. The method as claimed in claim 2, wherein the gate electrode overlies at least two of the junction regions.

4. The method as claimed in claim 1, wherein the step of forming the first mask comprises:
   providing a first integrated circuit layout database comprising data of the first type well; and
   forming the first mask by using the first integrated circuit layout database.

5. The method as claimed in claim 1, wherein a method for forming the second mask comprises:
   providing a second integrated circuit layout database comprising data of the first type well, data of the second type well and data of the plurality of junction regions;
   accessing the second integrated circuit layout database and performing a Boolean logic operation to obtain an operation result; and
   using the operation result to form the second mask.

6. The method as claimed in claim 1, wherein the first type well is a P-type well or an N-type well.

7. The method as claimed in claim 1, wherein the second type well is a P-type well or an N-type well and has an opposite conductive type to the first type well.

8. The method as claimed in claim 1, wherein the length of the plurality of junction regions is about 0.2-5 μm.

9. The method as claimed in claim 1, wherein the plurality of junction regions are doped with both P-type ions and N-type ions, and the plurality of junction regions is formed by the first type ion implant which forms the first type well and by the second type ion implant which forms the second type well.

10. The method as claimed in claim 9, wherein implant dosage of the P-type ions is greater than that of the N-type ions.

11. The method as claimed in claim 9, wherein the implant dosage of the P-type ions is less than that of the N-type ions.

12. The method as claimed in claim 1, wherein the plurality of junction regions has substantially the same conductive type with the semiconductor substrate, and the plurality of junction regions is formed by the first type ion implant which forms the first type well and by the second type ion implant which forms the second type well.

13. The method as claimed in claim 1, wherein the semiconductor substrate further comprises a plurality of isolation structures.

14. The method as claimed in claim 13, wherein the isolation structures are shallow trench isolations formed by a shallow trench process.

15. The method as claimed in claim 13, wherein the isolation structures are field oxides formed by local oxidation of silicon.

* * * * *